United States Patent [19]

Iwamoto

[11] Patent Number: 5,266,519
[45] Date of Patent: Nov. 30, 1993

[54] METHOD FOR FORMING A METAL CONDUCTOR IN SEMICONDUCTOR DEVICE

[75] Inventor: Yasuhiko Iwamoto, Tokyo, Japan
[73] Assignee: NEC Corporation, Japan
[21] Appl. No.: 975,478
[22] Filed: Nov. 12, 1992

[30] Foreign Application Priority Data

Nov. 12, 1991 [JP] Japan .................. 3-295320

[51] Int. Cl.⁵ .......................................... H01L 21/445
[52] U.S. Cl. ................... 437/183; 437/192; 437/230; 437/235; 437/190; 427/98
[58] Field of Search .............. 437/183, 230, 235, 192, 437/201, 190, 193, 200; 427/126.5, 98; 257/737, 763

[56] References Cited

U.S. PATENT DOCUMENTS

| | | | |
|---|---|---|---|
| 4,182,781 | 1/1980 | Hooper et al. | 437/230 |
| 4,293,637 | 10/1981 | Hatada et al. | 437/183 |
| 4,434,544 | 3/1984 | Dohya et al. | 257/751 |
| 4,652,336 | 3/1987 | Andrascek et al. | 437/192 |
| 4,786,523 | 11/1988 | Dohya | 427/96 |
| 4,970,574 | 11/1990 | Tsunenari | 257/753 |
| 5,069,748 | 12/1991 | Przybysz | 437/192 |
| 5,116,463 | 5/1992 | Lin et al. | 427/98 |
| 5,130,275 | 7/1992 | Dion | 437/190 |
| 5,164,332 | 11/1992 | Kumar | 437/198 |

FOREIGN PATENT DOCUMENTS

| | | | |
|---|---|---|---|
| 54-161285 | 12/1979 | Japan | 437/190 |
| 56-37636 | 4/1981 | Japan | 437/183 |
| 58-202555 | 11/1983 | Japan | 437/190 |
| 63-29940 | 2/1988 | Japan | 437/183 |
| 63-122248 | 5/1988 | Japan | 437/183 |

Primary Examiner—T. N. Quach
Attorney, Agent, or Firm—Laff, Whitesel Conte & Saret

[57] ABSTRACT

An oxidizable metal film and a barrier metal film are formed in the named order on an insulating film formed on a semiconductor substrate or in a contact hole formed through the insulating film. A gold film is selectively formed on the barrier metal film in alignment with the contact hole. The barrier metal is selectively removed using the gold film as a mask, and an exposed surface of the oxidizable metal film is oxidized. A second metal film is deposited on only a surface of the gold film by an electroplating using the oxidized surface of the oxidizable metal film as an anti-plating mask. Finally, the oxidizable metal film not covered by the gold film is completely oxidized.

11 Claims, 5 Drawing Sheets

METHOD FOR FORMING A METAL CONDUCTOR IN SEMICONDUCTOR DEVICE

BACKGROUND OF THE INVENTION

1. Field of the invention

The present invention relates to a method of manufacturing a semiconductor device, and more specifically to a method of forming a metal conductor in a semiconductor device.

2. Description of related art

At present, in most of semiconductor devices including ICs (integrated circuits) to VLSIs (very large scaled integrated circuits), an Al-Si alloy or an Al-Si-Cu alloy has been widely used as a material of a wiring conductor from the standpoint of an ohmic characteristics and an Al spike suppression. However, even if these wiring conductor materials are used, it has not been possible to avoid generation of electromigration and formation of hillock caused by a heat treatment, and therefore, a serious problem has existed in reliability. In order to overcome this problem, it has been proposed to form a wiring conductor of a multilayered structure by using a refractory metal. Nevertheless, it has not been satisfactory.

Recently, it has been proposed to form a wiring conductor of Au (gold). Au is extremely stable from the viewpoint of the wiring conductor material. In addition, anti-electromigration property is as excellent as ten times or more that of an aluminum alloy. Furthermore, Au has high reliability. However, Au is disadvantageous in that an adhesion property to an interlayer film is very poor. Because of this reason, the conventional Au wiring has been realized by providing on an upper surface of an Au wiring conductor a metal film having a good adhesion property to the interlayer film.

However, in a conventional process, it has been difficult to form a metal film on the upper surface of the Au wiring conductor in alignment with the Au wiring conductor. Therefore, if mis-alignment occurs, a short-circuit occurs between wiring conductors or between electrodes. Because of this, it has not been used in a fine pattern wiring. In addition, the conventional process has required a number of steps and has been complicated.

In this connection, a method has been known in which after an electrode or wiring conductor is formed, the electrode or wiring conductor is coated by an electroless plating. This method has been difficult to obtain a complete selectivity, and therefore, could not have been applied to the fine pattern wiring.

SUMMARY OF THE INVENTION

Accordingly, it is an object of the present invention to provide a novel method for forming a wiring conductor, which method has overcome the above mentioned defect of the conventional one.

Another object of the present invention is to provide a method for forming a wiring conductor, which method can form a metal film on the upper surface of an electrode or a wiring conductor in a self-alignment manner and with a reduced number of steps.

The above and other objects of the present invention are achieved in accordance with the present invention by a method for forming a metal conductor in a semiconductor device, comprising the steps of forming a first metal film including at least one oxidizable metal layer, on a layer formed at a semiconductor substrate, forming a metal conductor on a predetermined region of the first metal film, selectively removing the first metal film not covered by the metal conductor so that the oxidizable metal layer is exposed in an area not covered by the metal conductor, oxidizing an exposed surface of the oxidizable metal layer, forming a second metal film on only a surface of the metal conductor, and completely oxidizing the oxidizable metal layer not covered by the metal conductor.

Here, the term "oxidizable metal" should be understood to mean a metal which can be oxidized in a conventional semiconductor manufacturing process, and whose oxide is a good electrical insulator. In this connection, it is more preferable that the oxide of the "oxidizable metal" has a good adhesion property to an interlayer film formed in the semiconductor device.

In one embodiment, the metal conductor is formed by an electroplating or an electroless plating such as a sputtering, and the second metal film is formed by an electroplating using the metal conductor as a voltage supplying layer and using the oxidized surface of the oxidizable metal layer as an anti-plating mask. The metal conductor is preferably formed of Au. In addition, the first metal film is formed in a double-layer structure composed of a first metal layer formed of a material selected from the group consisting of Ti, TiW and Cr and a second layer formed of a material selected from the group consisting of Cu, Pt, Pd, Ni and Au, the first metal layer being formed on the second metal layer. On the other hand, the second metal film is formed of Ni, Au, Co and Pd.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the method in accordance with the present invention for forming a metal conductor in the semiconductor device will be explained with reference to FIGS. 1A to 1F.

A principal surface of a semiconductor substrate 11 is coated with an insulating film 12, and a diffusion layer 14 is formed in a predetermined region of the principal surface of a semiconductor substrate 11. In this embodiment, in order to form a fine and shallow diffusion layer 14, a polysilicon layer 15 added with impurity is used as a diffusion source, and is also utilized as a lead-out electrode.

For this purpose, a hole 12A is formed in the insulating film 12 to reach the principal surface of a semiconductor substrate 11. The polysilicon layer 15 added with impurity is deposited so as cover not only an upper surface of the insulating film 12 but also a side surface and a bottom surface of the hole 12A. Therefore, the polysilicon layer 15 is deposited on the principal surface of a semiconductor substrate 11 exposed within the hole 12A. The deposited polysilicon layer 15 is patterned so that the polysilicon layer 15 remains only within the hole 12A and on a periphery of the hole 12A. In this condition or in any step after this condition, if a heat treatment is performed, impurities included in the polysilicon layer 15 are caused to diffuse into the semiconductor substrate 11, so that the shallow diffusion layer 14 is formed.

Figure 1A:
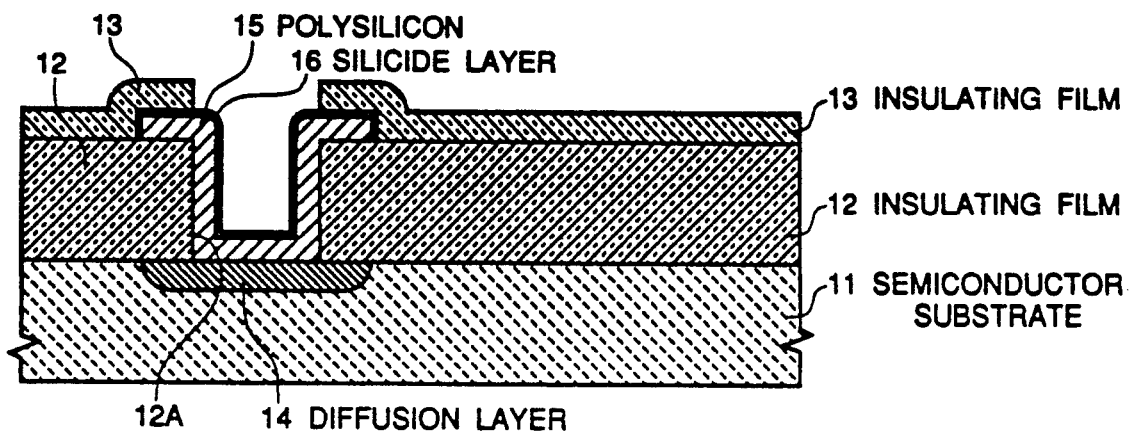
FIGS. 1A to 1F are diagrammatic partial sectional views of a semiconductor device, for illustrating various steps of one embodiment of the method in accordance with the present invention for forming a metal conductor in the semiconductor device.

Thereafter, in order to reduce a contact resistance between the polysilicon layer 15 and a possible electrode conductor, a silicide layer 16 is formed so as to cover only the polysilicon layer 15. Furthermore, an oxide film is grown by a chemical vapor deposition process so as to form an insulating film 13 which covers a whole surface of the insulating film 12 and the silicide layer 16 and which has a thickness on the order of 200 nm to 500 nm. An opening is formed in a predetermined position of the insulating film 13 in alignment with the hole 12A coated with the polysilicon layer 15. Thus, the structure as shown in FIG. 1A is obtained. Here, the hole 12A coated with the polysilicon layer 15 constitutes a contact hole for an electrode and wiring conductor formation.

Figure 1B:
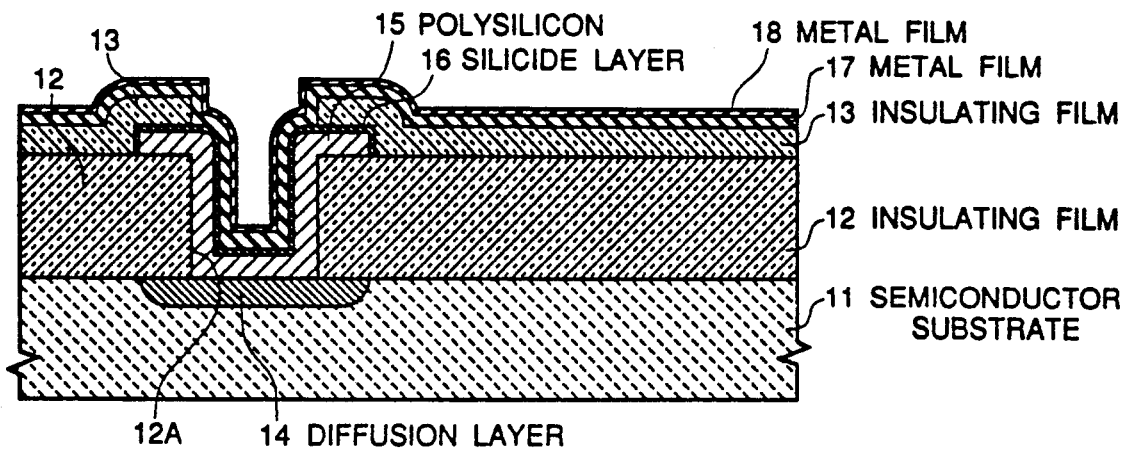

Thereafter, on the whole surface of the substrate 11 including the contact hole 12A, an oxidizable metal film 17 and a barrier metal film 18 are formed in the named order by for example a sputtering. The oxidizable metal film 17 is formed of a metal which can be oxidized in a conventional semiconductor manufacturing process so as to form an oxide film having a good electrical insulating property and a good adhesion property to an insulating film formed in the conventional semiconductor manufacturing process. For example, the oxidizable metal film 17 is formed of Ti, TiW, Cr, etc. On the other hand, the barrier metal film 18 is formed of a metal having a good plating property and a good barrier property for protecting the underlying oxidizable metal film 17. For example, the barrier metal film 18 is formed of Cu, Pt, Pd, Ni, Au, etc. It is sufficient if the oxidizable metal film 17 has a thickness of 50 nm to 150 nm and if the barrier metal film 18 has a thickness of 30 nm to 100 nm. Here, it should be understood that the metal films 17 and 18 can be replaced with a single metal film which can satisfy both the condition of the oxidizable metal film 17 and the condition of the barrier metal film 18. Thus, the structure as shown in FIG. 1B is obtained.

Figure 1C:
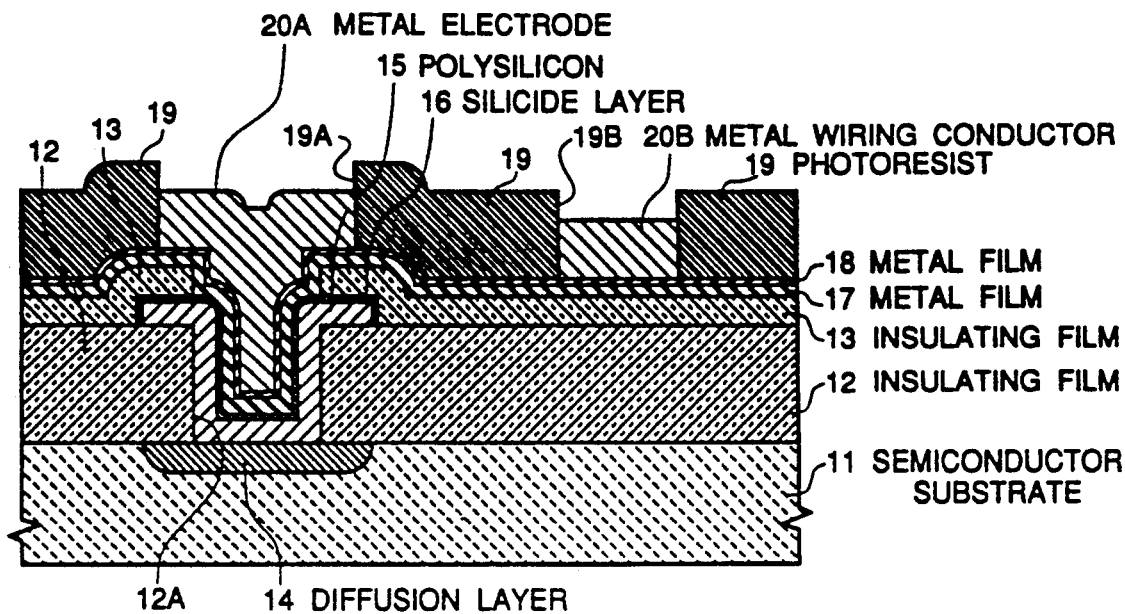

Then, on the barrier metal film 18, there is formed a patterned photoresist layer 19 having openings in alignment to positions where a metal electrode or a metal wiring conductor is to be formed in a later step. In the shown embodiment, one opening 19A is formed in alignment with the contact hole 12A, and another opening 19B is formed on a planar region of the metal film 18 under which no contact hole is formed. By using the metal films 17 and 18 as a voltage supplying layer, a metal electrode 20A and a metal wiring conductor 20B of Au (gold) are formed by an electroplating. It is sufficient if these metal electrode 20A and metal wiring conductor 20B have a thickness of 0.5 μm to 2.0 μm. An electroplating solution for the Au plating is commercially available from Tanaka Noble Metal Industries, Co., Ltd. or a few other companies. Thus, the structure as shown in FIG. 1C is obtained.

After the photoresist layer 19 is removed, the barrier metal film 18 is selectively removed using the Au electrode 20A and the Au wiring conductor 20B as a mask, so that the oxidizable metal film 17 is exposed. Removal of the barrier metal film 18 is performed by for example a reactive ion etching. In this case, an etching gas can be selected from Ar, $O_2$, Ne, $SF_6$, $C_2Cl_2F_4$, etc., in combination on the basis of the kind of the metal.

Figure 1D:
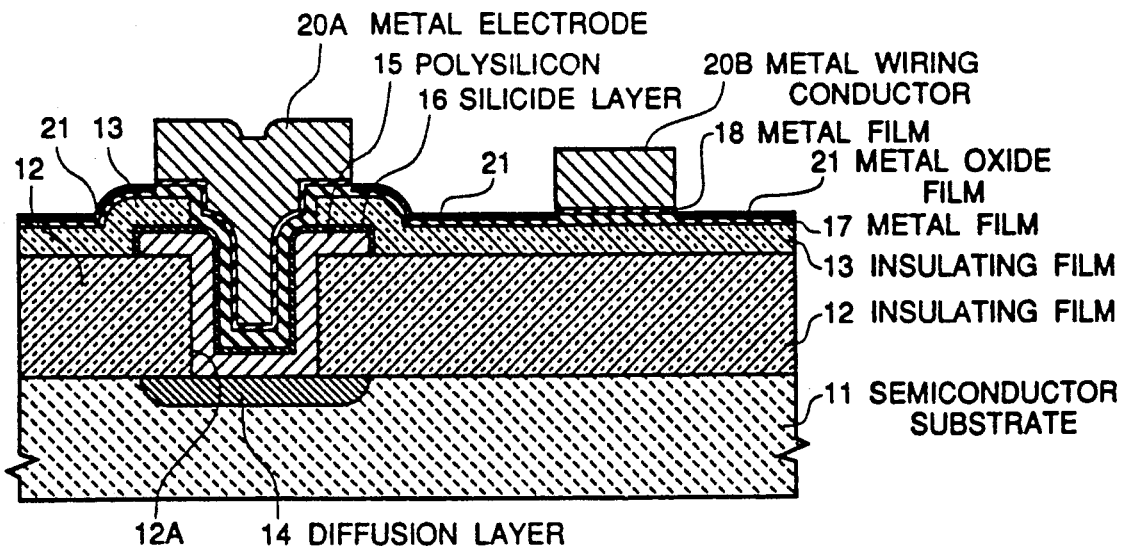

Next, a heat treatment is performed in $H_2$—$O_2$ atmosphere at a temperature of 400° C. for a time period of 30 minutes, so that an exposed surface of the oxidizable metal film 17 is oxidized so as to form a metal oxide film 21, which functions as an anti-plating film in a succeeding step. Under this condition, the metal oxide film 21 has a thickness of 10 nm to 20 nm. Thus, the structure as shown in FIG. 1D is obtained.

Figure 1E:
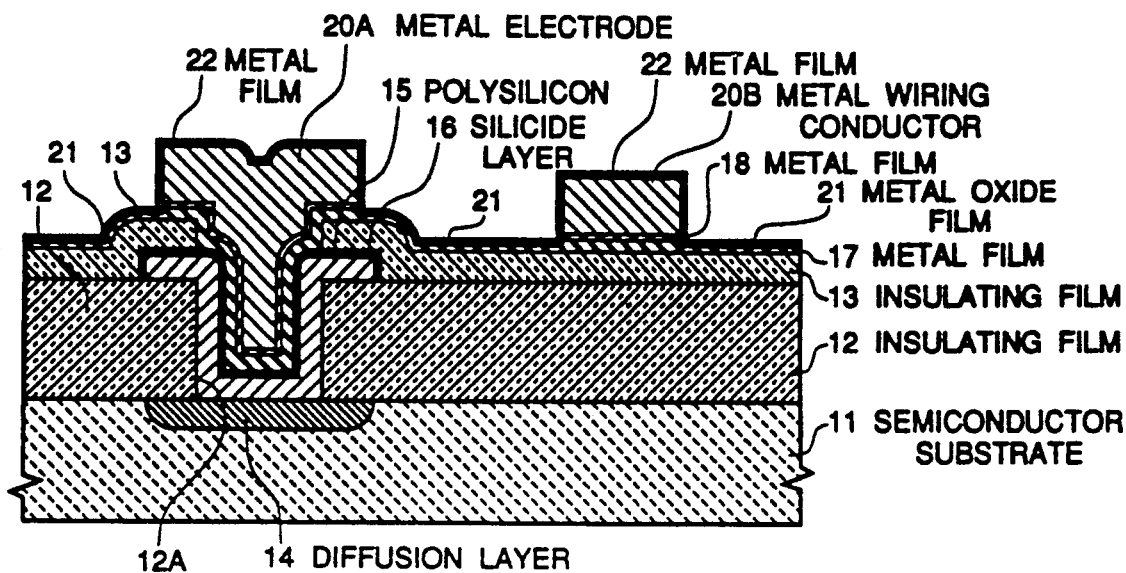

Thereafter, by using the metal oxide film 21 as a anti-plating mask and using the Au electrode 20A and the Au wiring conductor 20B as a voltage supplying layer, a metal film 22 is formed by an electroplating. Therefore, only an exposed surface of the Au electrode 20A and the Au wiring conductor 20B is coated with the metal film 22. This metal film 22 is preferably formed of Ni, Au, Co and Pd. Ni is most preferable. Thus, the structure as shown in FIG. 1E is obtained.

Furthermore, a heat treatment is performed in $H_2$—$O_2$ atmosphere at a temperature of 400° C. to 450° C. for a time period of 60 minutes to 120 minutes,.so as to further oxidize the oxidizable metal film 17, so that all of the oxidizable metal film 17 excluding a metal electrode and wiring region is converted into a metal oxide film 21. As mentioned above, since the metal film 17 is oxidizable, the metal film 17 is completely converted by the heat treatment into a metal oxide film having a complete electric insulation property. On other hand, the metal film 22, which is preferably formed of Ni and which is deposited on the Au electrode 20A and the Au wiring conductor 20B, will ensure an adhesion property to an insulating film 23 formed in a succeeding step. Since the function of the metal film 22 is to ensure the adhesion property, it is sufficient if the metal film 22 has a thickness of at least 30 nm. An electroplating solution for the Ni plating is commercially available from Nippon Kanisen K. K., Tanaka Noble Metal Industries, Co., Ltd. or a few other companies.

Figure 1F:
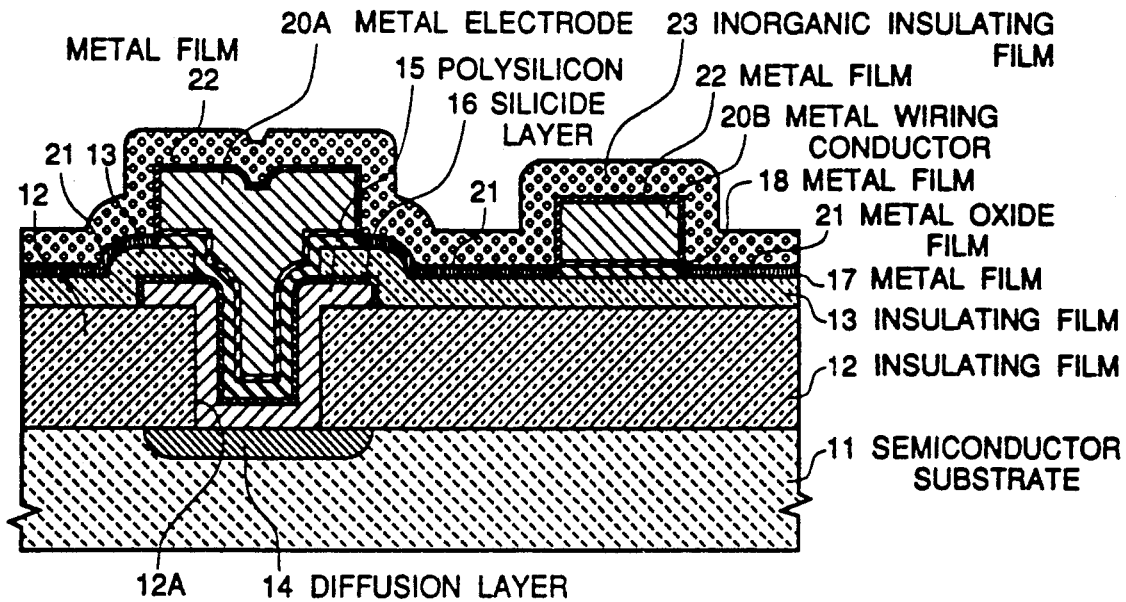

Thereafter, a CVD oxide film is deposited so as to form an inorganic insulating film 23 having a thickness of 0.5 μm to 1.0 μm. Thus, the structure as shown in FIG. 1F is obtained.

As will be apparent from the above, since the metal oxide film 21 is used as the plating mask in the electroplating of the metal film 22 and since the surface-oxidized metal film 17 is completely oxidized and converted into an insulating film, a metal film having a good adhesion property to an interlayer insulating film can be formed only on the surface of the Au electrode 20A and the Au wiring conductor 20B, and the metal oxide film gives a good adhesion property to an underlying insulating film and an overlying insulating film.

Referring to FIGS. 2A to 2D, a second embodiment of the method in accordance with the present invention for forming a metal conductor in the semiconductor device will be explained.

On the substrate 11 prepared similarly to that shown in FIG. 1A, a metal film 17 and another metal film 24 are deposited in the named order by for example a sputtering, so as to cover the whole surface of the substrate including the contact hole 12A, similarly to the first embodiment. The metal film 17 is formed of a metal which has a good adhesion property to the insulating film 13 and which can be oxidized in a conventional semiconductor manufacturing process so as to form an oxide film having a good electrical insulating property and a good adhesion property to an insulating film formed in the conventional semiconductor manufacturing process. For example, the oxidizable metal film 17 is formed of Ti, TiW, Cr, etc. On the other hand, the metal film 24 is formed of a metal having a good barrier property for the contact hole. For example, the metal film 24 is formed of Cu, Pt, Pd, Ni, etc. It is sufficient if the metal film 24 has a thickness of 30 nm to 100 nm. In addition, if both the condition of the oxidizable metal film 17 and the condition of the barrier metal film 24 are satisfied, the metal films 17 and 24 can be replaced with a single metal film.

Figure 2A:
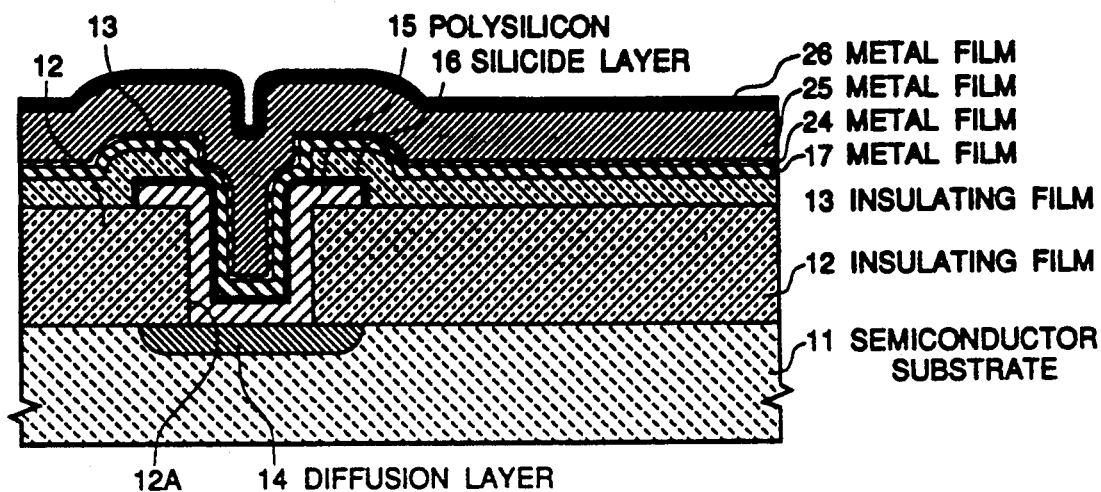
FIGS. 2A to 2D are diagrammatic partial sectional views of a semiconductor device, for illustrating various steps of another embodiment of the method in accordance with the present invention for forming a metal conductor in the semiconductor device.

Furthermore, Au (gold) is deposited by a sputtering so as to form a metal film 25 having a thickness of 0.3 μm to 1.0 μm, for the purpose of forming an electrode or a wiring conductor of Au. In addition, a metal film 26 is formed, which can be used as a mask when the metal films 24 and 25 are removed by a reactive ion etching. This metal film is formed of for example Al (aluminum), and has a thickness of 100 nm to 200 nm. Thus, the structure as shown in FIG. 2A is obtained.

Figure 2B:
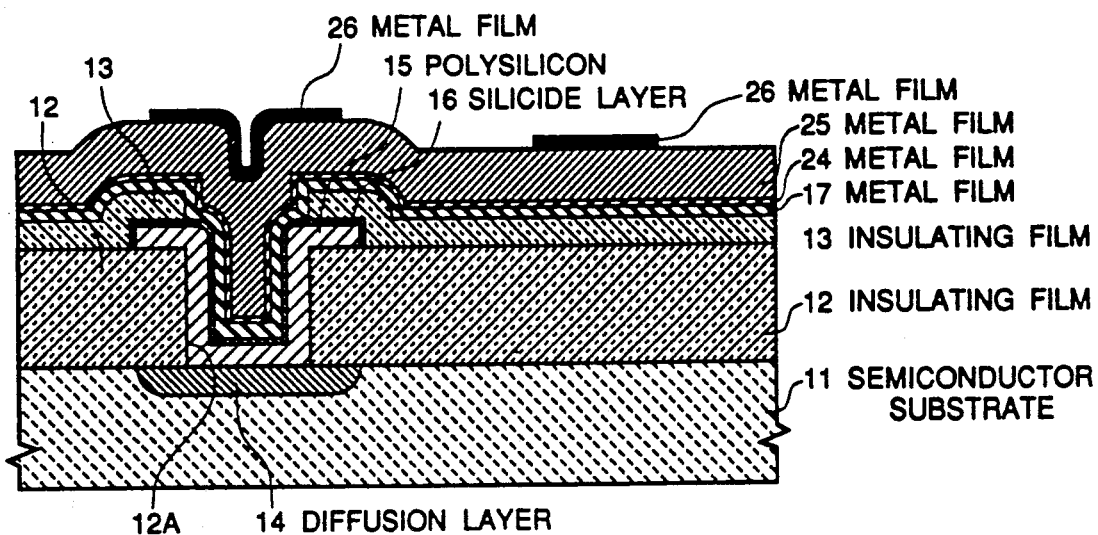

Thereafter, the metal film 26 is selectively removed by using a photoresist (not shown) so that the metal film 26 remains only in an area in which the metal electrode or the metal wiring conductor will be formed in future. Removal of the metal film 26 can be performed by a reactive ion etching using a chloride gas such as $CCl_4$ or $BCl_3$. Thus, the structure as shown in FIG. 2B is obtained.

Then, the metal films 25 and 24 are selectively removed in the named order by a reactive ion etching using the remaining metal film 26 as a mask, so that a metal electrode 25A and a metal wiring conductor 25B are formed. At this time, if $Ar + O_2$ gas or $Ne + O_2$ gas is used for this reactive ion etching, an etch rate of 100 mm/min to 200 nm/min can be obtained. Thereafter, the remaining metal film 26 which was used as the mask is removed by for example a wet etching. An etching liquid is composed of a mixed liquid of phosphoric acid, acetic acid and nitric acid. Thus, the structure as shown in FIG. 2C is obtained.

Figure 2C:
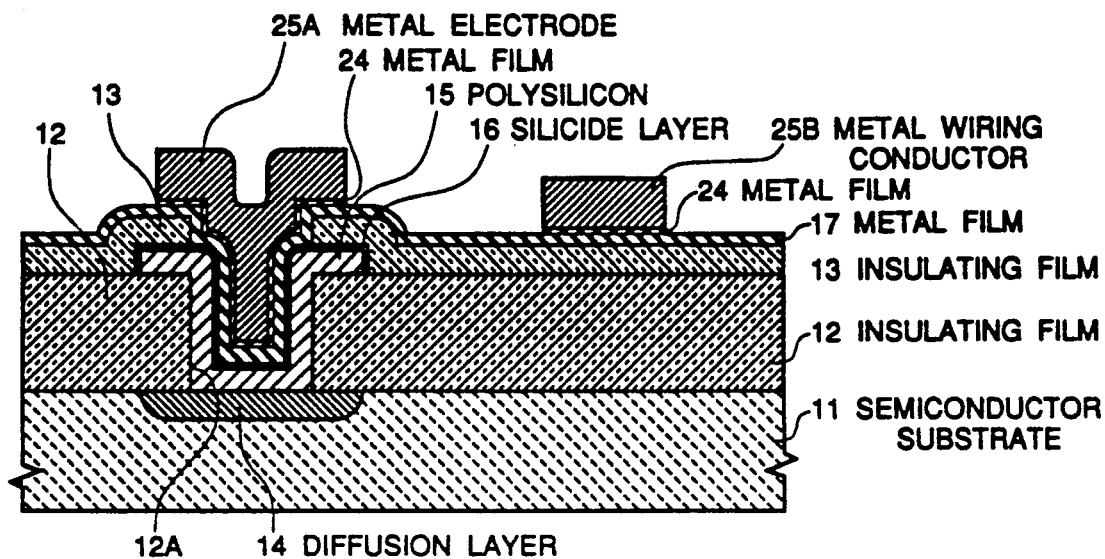
Figure 2D:
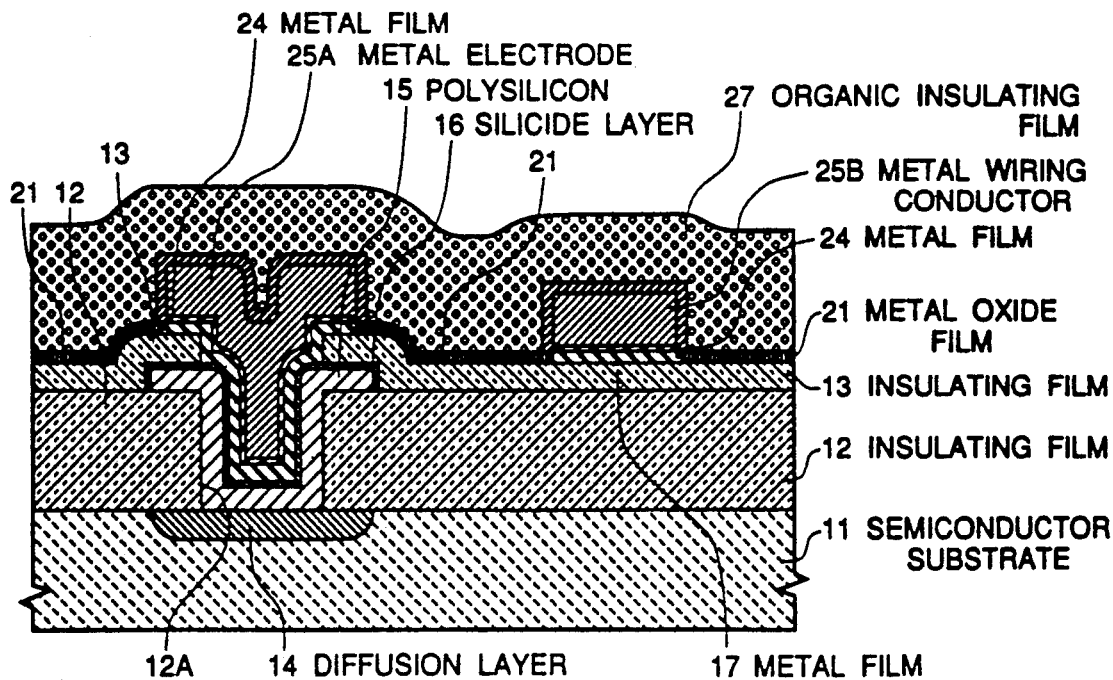

The structure as shown in FIG. 2C corresponds to the structure as shown in FIG. 1C in which the photoresist 19 is further removed. Therefore, the succeeding process is performed similarly to the first embodiment, until the structure as shown in FIG. 2D is obtained.

In the second embodiment, an insulating film 27 deposited as an interlayer film covering the whole of the substrate is formed of an organic material, such as silicon polyimide, differently from the inorganic film 23 formed in the first embodiment. The insulating film 27 has a thickness of 1.0 μm to 2.0 μm.

As seen from the above, the interlayer insulating film can be formed of either an inorganic material or an organic material. However, if the organic interlayer insulating film is used, a planarization can be remarkably elevated.

In the above mentioned embodiments, the metal electrode and the metal wiring conductor are formed of Au (gold), but can be formed of aluminum alloy. If the above mentioned process is applied to a metal electrode and a metal wiring conductor of aluminum alloy, it is very effective in preventing generation of electromigration and formation of hillock caused by a heat treatment.

As will be apparent from the above explanation of the embodiments with reference to the drawings, the metal electrode and/or the metal wiring conductor can be easily coated with a metal layer in a self-alignment manner by an electroplating. Therefore, it is possible to realize a semiconductor device having a high reliability with no short-circuiting caused by misalignment and with a good adhesion between the insulating film and the metal electrode and/or the metal wiring conductor. Furthermore, since no high degree of alignment technique is required for forming a metal layer applied for improving the adhesion property of the metal electrode and/or wiring conductor, the process becomes simple and the required number of steps is reduced.

The invention has thus been shown and described with reference to the specific embodiments. However, it should be noted that the present invention is in no way limited to the details of the illustrated structures but changes and modifications may be made within the scope of the appended claims.

I claim:

1. A method for forming a metal conductor in a semiconductor device, comprising the steps of forming a first metal film including at least one oxidizable metal layer, on a layer formed at a semiconductor substrate, forming a metal conductor on a predetermined region of said first metal film, selectively removing said first metal film not covered by said metal conductor so that said oxidizable metal layer is exposed in an area not covered by said metal conductor, oxidizing an exposed surface of said oxidizable metal layer, forming a second metal film on only a surface of said metal conductor, and completely oxidizing said oxidizable metal layer not covered by said metal conductor.

2. A method claimed in claim 1 wherein said metal conductor is formed by an electroplating or an electroless plating and said second metal film is formed by an electroplating using said metal conductor as a voltage supplying layer and using the oxidized surface of said oxidizable metal layer as an anti-plating mask.

3. A method claimed in claim 1 or 2 wherein said metal conductor is formed of Au, and said first metal film is formed in a double-layer structure composed of a first metal layer formed of a material selected from the group consisting of Ti, TiW and Cr and a second layer formed of a material selected from the group consisting of Cu, Pt, Pd, Ni and Au, said first metal layer being formed on said second metal layer.

4. A method claimed in claim 3 wherein said second metal film is formed of Ni, Au, Co and Pd.

5. A method claimed in claim 3 wherein formation of said metal conductor is performed by depositing a patterned photoresist layer having an opening at a position where said metal conductor is to be formed, selectively depositing a metal layer on said first metal film by an electroplating using said patterned photoresist layer as a mask and using said first metal film as a voltage supplying layer so that said metal layer on said first metal film not covered by said patterned photoresist layer constitutes said metal conductor, and removing said patterned photoresist layer so that said first metal film not covered by said metal conductor is exposed.

6. A method claimed in claim 3 wherein formation of said metal conductor is performed by depositing first and second metal layers on said first metal film in the named order, patterning said second metal layer so that said second metal layer remains only at a position where said metal conductor is to be formed, selectively removing said first metal layer using said patterned second metal layer as a mask, so that a patterned first metal layer constitutes said metal conductor and said first metal film not covered by said metal conductor is exposed, and removing said patterned second metal layer.

7. A method claimed in claim 1 or 2 wherein said second metal film is formed of Ni, Au, Co and Pd.

8. A method claimed in claim 7 wherein formation of said metal conductor is performed by depositing a patterned photoresist layer having an opening at a position where said metal conductor is to be formed, selectively depositing a metal layer on said first metal film by an electroplating using said patterned photoresist layer as a mask and using said first metal film as a voltage supplying layer so that said metal layer on said first metal film not covered by said patterned photoresist layer constitutes said metal conductor, and removing said patterned photoresist layer so that said first metal film not covered by said metal conductor is exposed.

9. A method claimed in claim 7 wherein formation of said metal conductor is performed by depositing first and second metal layers on said first metal film in the named order, patterning said second metal layer so that said second metal layer remains only at a position where said metal conductor is to be formed, selectively removing said first metal layer using said patterned second metal layer as a mask, so that a patterned first metal layer constitutes said metal conductor and said first metal film not covered by said metal conductor is exposed, and removing said patterned second metal layer.

10. A method claimed in any of claim 1 or 2 wherein formation of said metal conductor is performed by depositing a patterned photoresist layer having an opening at a position where said metal conductor is to be formed, selectively depositing a metal layer on said first metal film by an electroplating using said patterned photoresist layer as a mask and using said first metal film as a voltage supplying layer so that said metal layer on said first metal film not covered by said patterned photoresist layer constitutes said metal conductor, and removing said patterned photoresist layer so that said first metal film not covered by said metal conductor is exposed.

11. A method claimed in any of claim 1 or 2 wherein formation of said metal conductor is performed by depositing first and second metal layers on said first metal film in the named order, patterning said second metal layer so that said second metal layer remains only at a position where said metal conductor is to be formed, selectively removing said first metal layer using said patterned second metal layer as a mask, so that a patterned first metal layer constitutes said metal conductor and said first metal film not covered by said metal conductor is exposed, and removing said patterned second metal layer.

* * * * *